United States Patent
Hikita et al.

(10) Patent No.: US 6,921,859 B2
(45) Date of Patent: Jul. 26, 2005

(54) ELECTROMAGNETIC WAVE SHIELDING WINDOW, MANUFACTURING APPARATUS HAVING THE SAME, TRANSPORT SYSTEM HAVING THE SAME, BUILDING CONSTRUCTION HAVING THE SAME, AND ELECTROMAGNETIC WAVE SHIELDING METHOD

(75) Inventors: Osamu Hikita, Osaka (JP); Takashi Kakimoto, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/809,086

(22) Filed: Mar. 25, 2004

(65) Prior Publication Data

US 2005/0039936 A1 Feb. 24, 2005

Related U.S. Application Data

(63) Continuation of application No. PCT/JP01/08459, filed on Sep. 27, 2001.

(30) Foreign Application Priority Data

Mar. 31, 2000 (JP) ....................................... 2000-098242

(51) Int. Cl.[7] .................................................. H05K 9/00
(52) U.S. Cl. ................................ 174/35 GC; 428/914; 428/457
(58) Field of Search .......................... 174/35 R, 35 GC, 174/35 MS; 428/192, 414, 915, 416, 417, 418, 426, 436, 457, 458, 469

(56) References Cited

U.S. PATENT DOCUMENTS

| | | | |
|---|---|---|---|
| 4,732,454 A | * | 3/1988 | Saito et al. .................. 359/585 |
| 5,139,850 A | * | 8/1992 | Clarke et al. ................ 428/192 |
| 5,885,714 A | * | 3/1999 | Demeester .................. 428/441 |
| 6,049,037 A | * | 4/2000 | Schlatmann ........... 174/35 MS |
| 6,229,085 B1 | * | 5/2001 | Gotoh et al. ........... 174/35 MS |

FOREIGN PATENT DOCUMENTS

| | | |
|---|---|---|
| EP | 0 277 818 A2 | 8/1988 |
| EP | 0 883 156 A2 | 12/1998 |
| JP | 3-131094 A | 6/1991 |
| JP | 9-107193 | 4/1997 |
| JP | 10-322082 A | 12/1998 |
| JP | 11-084041 | 3/1999 |
| JP | 11-097878 | 4/1999 |

* cited by examiner

Primary Examiner—Dean A. Reichard
Assistant Examiner—Carmelo Oliva
(74) Attorney, Agent, or Firm—Pearne & Gordon LLP

(57) ABSTRACT

The present invention provides an electromagnetic wave shielding method and window capable of bringing a conductive shielding layer into conduction to the outside without a connecting structure, and a manufacturing apparatus, a transport system, and a building construction each having the electromagnetic wave shielding window. In the invention, a conductive shielding layer having a visible light transmitting property is provided on a surface of window face members having an electrical insulating property and a visible light transmitting property, and the window face members provided with the conductive shielding layer are brought into close adhesion and thereby fixed to a conductive window frame member through an insulation layer provided to a rim portion, whereby electrostatic-capacitance coupling is induced between the conductive shielding layer and the window frame member. It leads to achieve the electromagnetic wave shielding effect without establishing a direct electrical connection for the conductive shielding layer.

12 Claims, 16 Drawing Sheets

ELECTROMAGNETIC WAVE SHIELDING WINDOW, MANUFACTURING APPARATUS HAVING THE SAME, TRANSPORT SYSTEM HAVING THE SAME, BUILDING CONSTRUCTION HAVING THE SAME, AND ELECTROMAGNETIC WAVE SHIELDING METHOD

BACKGROUND OF THE INVENTION

1. Field of the Invention

The present invention relates to an electromagnetic wave shielding method and an electromagnetic wave shielding window for allowing passing of visible light while reducing passing of an electromagnetic wave to a predetermined level or below, a manufacturing apparatus having the electromagnetic wave shielding window, a transport system having the electromagnetic wave shielding window, and a building construction having the electromagnetic wave shielding window.

2. Description of the Related Art

Recently, emission of unwanted electromagnetic energy has been on the increase with increasing use of electric energy, and adverse effects of such emission to environments are being concerned. The environmental issues posed by an electromagnetic wave include: mutual interference of channels and ghosts of a broadcast wave in regard to wireless communications; the safety of a robot system in regard to a manufacturing apparatus; reliability of a communications network in regard to information processing, etc. In regard to a transport system, electronic control is increasingly involved in the operation control in recent years, and fear for a malfunction is becoming a key issue. In regard to a building construction, a building construction itself has now become a huge antenna as a computer network is provided throughout the construction like the one called today's intelligent building, and because electromagnetic energy is emitted untreated to local residents, influences of electromagnetic wave energy to the bio-ecological system is also becoming a key issue.

Under these circumstances, a window member having an electromagnetic wave shielding ability and a light-transmitting property has been developed. A window member of this type is an electromagnetic wave shielding window disclosed, for example, in JP-A-11-84041, which is formed, as shown in FIG. 18, by disposing a conductive mesh 3 between two transparent substrates 1a and 1b to put these components together, and folding back the edge portion of the conductive mesh 3 that comes out of the transparent substrates 1a and 1b along the edge portion of the transparent substrate 1a to be attached to the transparent substrate with a conductive adhesion tape 5.

Also, an electromagnetic wave shielding window disclosed in JP-A-11-97878 is formed, as shown in FIG. 19, by disposing a transparent conductive film 9 between two transparent substrates 7a and 7b, and laminating a conductive adhesive tape 13 from the edge portion of the transparent conductive film 9 to the edge portion on the main surface of the transparent substrate 7b by way of the end face of the transparent substrate 7b.

Further, another electromagnetic wave shielding window shown in FIG. 20 is formed by interposing a conductive mesh 17 between plastic plates 15a and 15b, which are a pair of window face members, then applying a conductive coating material 19, such as silver paste, on the edge portions of the pair of plastic plates 15a and 15b and laminating a conductive tape 21 thereon, and fitting a metal window frame member 25 to the outside of the conductive tape 21 through a seal gasket 23.

These electromagnetic wave shielding windows become able to shield an electromagnetic wave at a transparent opening window as the transparent conductive shielding members 3, 9, and 17 are laminated and electrical conductive coupling is provided between the conductive shielding member and the window frame member.

The structure of the conventional electromagnetic wave shielding windows described above, however, has a problem that it becomes a complicated connecting structure due to the need to connect the conductive shielding member to the window frame or the like at the outside. In other words, in the case of the light-transmitting window member with the electromagnetic wave shielding ability shown in FIG. 18, the assembly process demands an elaborate step of folding back the edge portion of the conductive mesh along the edge portion of the transparent substrate.

Also, in the case of the electromagnetic wave shielding window shown in FIG. 19, there is a need for a work to laminate the conductive adhesive tape from the edge portion of the transparent conductive film to the edge portion on the main surface of one transparent substrate by way of the end face of the other transparent substrate.

Further, in the case of the electromagnetic wave shielding window shown in FIG. 20, there is a need for an elaborate work to apply the conductive coating material onto the end faces of a pair of window face members in allowing the conductive coating material to go into a space between the pair of window face members through a capillary phenomenon, so that electrical conductive coupling is provided between the window frame member and conductive fibers.

Moreover, precise and careful assembly is required for any of the electromagnetic wave shielding windows, because in the event that a local void is caused during the assembly of the electromagnetic wave shielding window, an electromagnetic wave leaks through the void and the shielding ability can no longer be ensured.

Furthermore, because an oxide coating film is generally formed or applied on the window frame member attached to a typical manufacturing apparatus, transport system, or building construction, part of the surface of the window frame member has to be scraped off, or tap processing or the like has to be applied in order to bring the window frame member and the conductive shielding member into conduction. Hence, the conventional electromagnetic wave shielding window demands an elaborate connecting work to connect the conductive shielding member and an outside grounding or the like, which poses a problem that not only man-hours needed for the work, but also the manufacturing cost is increased. Also, in a case where the conductive shielding member is connected to the outside grounding or the like through an adhesive agent, the connecting portion may deteriorate with time due to degradation, such as oxidation and corrosion, which poses a problem that a stable electromagnetic wave shielding effect cannot be achieved over a long period.

SUMMARY OF THE INVENTION

The invention was devised in view of the foregoing situations, and therefore, has an object to provide an electromagnetic wave shielding method and an electromagnetic wave shielding window capable of bringing a conductive shielding member into conduction to the outside without the need of a connecting structure, and a manufacturing apparatus, a transport system, and a building construction each having the electromagnetic wave shielding window, so that man-hours needed for manufacturing and the manufacturing cost can be reduced while a stable electromagnetic wave shielding effect is ensured over a long period.

The above and other objects are achieved by the arrangements as follows.

(1) An electromagnetic wave shielding method of the invention is characterized in that a conductive shielding layer having a visible light transmitting property is provided on a surface of a window face member having an electrical insulating property and a visible light transmitting property, and said window face member provided with said conductive shielding layer is brought into close adhesion and thereby fixed to a conductive window frame member through an insulation layer provided to a rim portion, whereby electrostatic-capacitance coupling is induced between said conductive shielding layer and said window frame member.

According to this electromagnetic wave shielding method, the conductive shielding layer is provided on the surface of the window face member having the electric insulating property, and the window face member is brought into close adhesion and thereby fixed to the window frame member with respect to the conductive shielding layer on the surface through the insulation layer, whereby electrostatic-capacitance coupling is induced between the conductive shielding layer and the window frame member. It is thus possible to achieve the electromagnetic wave shielding effect close to that achieved through electrical conductive coupling for high-frequency components through the condenser effect between the conductive shielding layer and the window frame member without establishing a direct electrical connection between the conductive shielding layer and the window frame member.

(2) An electromagnetic wave shielding method of the invention is characterized in that a conductive shielding layer having a visible light transmitting property is provided on a surface of a window face member having an electrical insulating property and a visible light transmitting property, a cushioned conductive tape is laminated by using an insulation adhesive layer to a rim portion of said window face member provided with said conductive shielding layer in such a manner that predetermined areas thereof oppose each other, said window face member provided with said conductive shielding layer and laminated with said conductive adhesion tape is brought into close adhesion and thereby fixed to a conductive window frame member, whose sectional plan shapes approximate horseshoe having integral and almost similarly cross section, through an insulation layer, whereby electrostatic-capacitance coupling is induced between said conductive shielding layer and said conductive tape and between said conductive tape and said window frame member.

According to this electromagnetic wave shielding method, the conductive shielding layer is provided on the surface of the window face member having the electric insulating property, and the cushioned conductive tape is laminated by using the insulation adhesive layer to the rim portion of the window face member provided with the conductive shielding layer in such a manner that predetermined areas thereof oppose each other, whereby electrostatic-capacitance coupling is induced between the conductive shielding layer and the conductive tape. Also, by bringing the window face member provided with the conductive shielding layer and laminated with the conductive tape into close adhesion in fixing to the conductive window frame member through the insulation layer, electrostatic-capacitance coupling is induced as well between the conductive tape and the window frame member. It is thus possible to achieve the electromagnetic wave shielding effect close to that achieved through electrical conductive coupling for high-frequency components through the condenser effect between the conductive tape and the window frame member. Also, not only can the electromagnetic wave shielding window be assembled through a simple assembly work of laminating the conductive tape, but also a stable shielding effect can be maintained over a long period because deterioration with time will not occur.

According to this electromagnetic wave shielding method, the conductive shielding layer and the window frame member are brought into mutual conduction as they are brought into contact with each other, while conduction for high-frequency components is enabled due to the condenser effect, which makes it possible to achieve the shielding effect in a more reliable manner.

(3) An electromagnetic wave shielding window of the invention is characterized by comprising: a window face member having an electrical insulating property and a visible light transmitting property; a conductive shielding layer laminated to a surface of said window face member and having a visible light transmitting property; a conductive window frame member to which said window face member provided with said conductive shielding layer is brought into close adhesion and thereby fixed through an insulation layer provided to a rim portion of said window face member; and a cushioned conductive tape laminated by using an insulation adhesive to said rim portion of said window frame member in said insulation layer with covering a predetermined space on and facing to said rim portion of aid window frame member, whose sectional plan shapes approximate horseshoe having integral and almost similarly cross section.

According to this electromagnetic wave shielding window, the conductive shielding layer is provided on the surface of the window face member having the electric insulating property, and the window face member is brought into close adhesion and thereby fixed to the window frame member with respect to the conductive shielding layer on the surface through the insulation layer, whereby electrostatic-capacitance coupling is induced between the conductive shielding layer and the window frame member. It is thus possible to achieve the electromagnetic wave shielding effect close to that achieved through electrical conductive coupling for high-frequency components through the condenser effect between the conductive shielding layer and the window frame member without establishing a direct electrical connection between the conductive shielding layer and the window frame member. Because a direct electrical connection is not established between the conductive shielding layer and the window frame member as has been described above, not only can the electromagnetic wave shielding window be assembled through a simple assembly work, but also a stable shielding effect can be maintained over a long period because deterioration with time will not occur. Moreover, according to the electromagnetic shielding window, the condenser effect can be induced through the dielectric effect of the window face member between the conductive shielding layer and the conductive adhesive tape through a simple lamination work such that the conductive adhesion tape is laminated to the rim portion of the window face member provided with the conductive shielding layer in such a manner that predetermined areas thereof on the rim portion oppose each other.

(4) An electromagnetic wave shielding window of the invention is characterized in that said insulation layer includes at least one of said window face member and an insulative surface layer formed on a surface of said window frame member.

According to this electromagnetic wave shielding window, by fixing the conductive shielding member to the window frame member through at least one of the window face member and the insulative surface layer formed on the window frame member, not only can the conductive shielding member be fixed to the window frame member in a non-conducting state, but also the condenser effect can be induced through the dielectric effect of the window face member or the insulative surface layer.

According to this electromagnetic wave shielding window, the condenser effect can be induced through the dielectric effect of the window face member between the conductive shielding layer and the conductive adhesive tape through a simple lamination work such that the conductive adhesive tape is laminated to the rim portion of the window face member provided with the conductive shielding layer in such a manner that predetermined areas thereof on the rim portion oppose each other.

(5) An electromagnetic wave shielding window of the invention is characterized in that said conductive tape is laminated to form a U-shaped cross section.

According to this electromagnetic wave shielding window, the surfaces of the conductive tape laminated to form a U-shaped cross section that are placed to oppose each other serve as electrodes together with the conductive shielding layer, and the condenser effect takes place in between. Also, because the edge portion of the window face member is covered with the conductive tape, not only can the edge portion of the window face member be protected, but also the window face member can be adhered closely to the window frame member in a reliable manner.

(6) An electromagnetic wave shielding window of the invention is characterized in that said conductive shielding layer is pinched between a pair of said window face members.

According to this electromagnetic wave shielding window, because the conductive shielding layer is pinched by the window face members from the main and back surfaces, it will not be exposed to the outside and is thereby fully protected. Also, because each of the main and back surfaces of the conductive shielding layer is placed to oppose the conductive tape through the window face members, the condenser effect takes place between each surface of the conductive shielding layer and the conductive tape.

(7) An electromagnetic wave shielding window of the invention is characterized in that said conductive shielding layer is provided on only one surface of said window face member.

According to this electromagnetic wave shielding window, the electromagnetic wave shielding window can be formed in a simple structure using a single window face member alone.

(8) An electromagnetic wave shielding window of the invention is characterized in that a protection sheet for said conductive shielding layer is laminated to an outside surface of said window face member on a side where said conductive shielding layer is provided.

According to this electromagnetic wave shielding window, because the protection sheet is provided to the outside of the conductive shielding member, it is possible to protect the conductive shielding layer while at the same time placing the conductive shielding layer and the conductive tape to oppose each other as in the insulation structure.

(9) An electromagnetic wave shielding window of the invention is characterized in that said conductive shielding layer is a net-like sheet member made of conductive fibers or fibers whose surfaces are coated with a conductive material.

According to this electromagnetic wave shielding window, because every single fiber forming the net-like sheet member is formed with the conductivity, it is possible to obtain satisfactory conductivity while possessing the visible light transmitting property through clearances among fibers.

(10) An electromagnetic wave shielding window of the invention is characterized in that said conductive shielding layer is a film-like sheet member having a conductive thin-film layer.

According to this electromagnetic wave shielding window, a conductive thin film is formed on the surface of the film-like sheet member through sputtering or the like, which makes it possible to obtain conductivity while possessing the visible light transmitting property. Also, because being a film, the conductive shielding member can be formed in a single plane, which makes it possible to reduce leaking of an electromagnetic wave in comparison with the net structure having openings.

According to this electromagnetic wave shielding window, both the conductive shielding layer and the window frame member are brought into conduction as they are brought into contact with each other, while conduction for high-frequency components is enabled due to the condenser effect, which makes it possible to achieve the shielding effect in a more reliable manner.

(11) A manufacturing apparatus having an electromagnetic wave shielding window of the invention is a manufacturing apparatus characterized in that it is provided with a view port shielded from an electromagnetic wave, through which visual confirmation of an interior of said manufacturing apparatus is allowed, and at least part of said view port is the electromagnetic wave shielding window set forth in any of the foregoing (3) to (10).

According to this manufacturing apparatus having the electromagnetic wave shielding window, because at least part of the view port is the electromagnetic wave shielding window set forth in any of the foregoing (3) to (10), the conductive shielding layer and the window frame member can be of a non-conducting structure, and the assembly process of the shielding window can be simplified markedly, which in turn makes it possible to save the costs of the overall apparatus. Moreover, not only can the shielding effect sufficient for the apparatus be achieved, but also the beauty of appearance can be increased because the shielding window can be simpler. In addition, in a case where both the conductive shielding layer and the window frame member are brought into conduction through contact, a more reliable shielding effect can be obtained.

(12) A transport system having an electromagnetic wave shielding window of the invention is a transport system characterized in that it is provided with a view port shielded from an electromagnetic wave, through which visual confirmation of an outside of said transport system is allowed, and at least part of said view port is the electromagnetic wave shielding window set forth in any of the foregoing (3) to (10).

According to this transport system having the electromagnetic wave shielding window, because at least part of the view port is the electromagnetic wave shielding window set forth in any of the foregoing (3) to (10), the conductive shielding layer and the window frame member can be of a non-conducting structure, and the assembly process of the shielding window can be simplified markedly, which in turn makes it possible to save the costs of the overall apparatus. Moreover, not only can the shielding effect sufficient for the apparatus be achieved, but also the beauty of appearance can be increased because the shielding window can be simpler. In addition, in a case where both the conductive shielding layer and the window frame member are brought into conduction through contact, a more reliable shielding effect can be obtained.

(13) A building construction having an electromagnetic wave shielding window of the invention is a building construction, for example, a building, a single house, etc., characterized in that it is provided with a view port shielded from an electromagnetic wave, through which visual confirmation of an outside of said building construction from inside is allowed, and at least part of said view port is the electromagnetic wave shielding window set forth in any of the foregoing (3) to (10).

According to this building construction having the electromagnetic wave shielding window, because at least part of the view port is the electromagnetic wave shielding window set forth in any of the foregoing (3) to (10), the conductive shielding layer and the window frame member can be of a non-conducting structure, and the assembly process of the shielding window can be simplified markedly, which in turn makes it possible to save the construction cost. Moreover, not only can the shielding effect sufficient for the building construction be achieved, but also the beauty of appearance can be increased because the shielding window can be simpler. In addition, in a case where both the conductive shielding layer and the window frame member are brought into conduction through contact, a more reliable shielding effect can be obtained.

Figure 1:
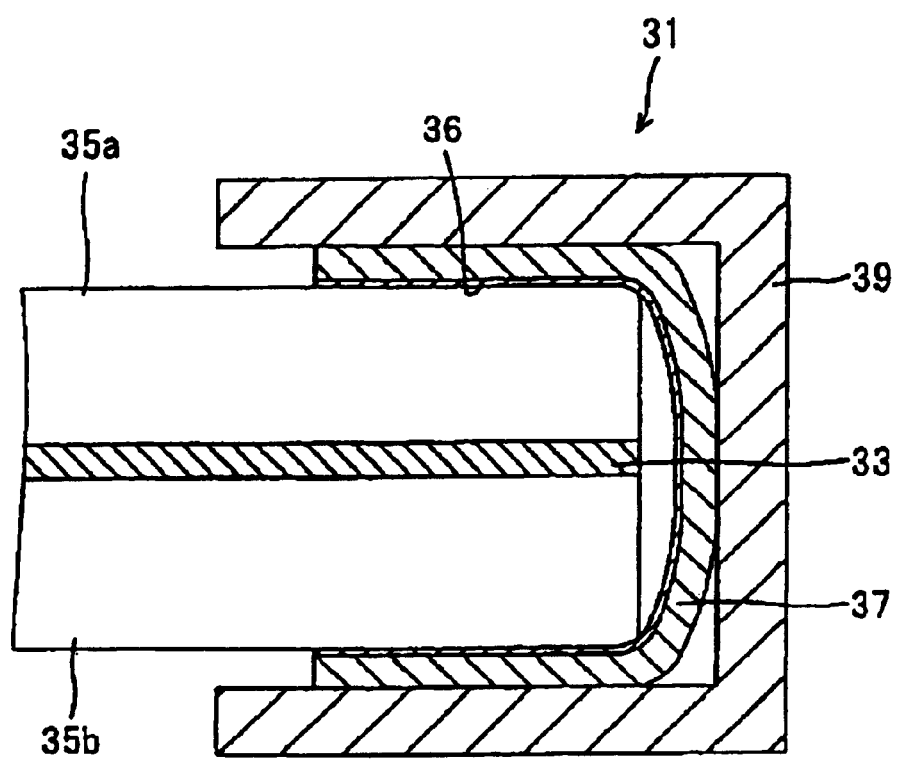
FIG. 1 is an enlarged cross section of a major portion showing a first embodiment of an electromagnetic wave shielding window of the invention.

In regard to reference numerals in the drawings, 31, 61, 71, 81, and 101 denote an electromagnetic wave shielding window, 33 denotes a conductive shielding layer, 35 (35a and 35b) denotes a window face member, 37 denotes a conductive adhesive tape, 38 denotes a conductive adhesive agent, 39 denotes a window frame member, 73 denotes a protection sheet, 91 denotes an electronic parts mounting apparatus, 95 denotes a front cover panel, 110 denotes a vehicle, 120 denotes a train, 130 denotes an airplane, and 140 denotes a building.

DETAILED DESCRIPTION OF THE PREFERRED EMBODIMENTS

The following description will describe in detail, with reference to the drawings, preferred embodiments of an electromagnetic wave shielding method, an electromagnetic wave shielding window, a manufacturing apparatus having the electromagnetic wave shielding window, a transport system having the electromagnetic wave shielding window, and a building construction having the electromagnetic wave shielding window of the invention.

The invention is characterized in that the shielding effect is achieved through the condenser effect by aggressively allowing a conductive shielding layer of the electromagnetic wave shielding window that conventionally needed a direct electrical connection to have electrostatic-capacitance coupling in a non-contact state.

Figure 2:
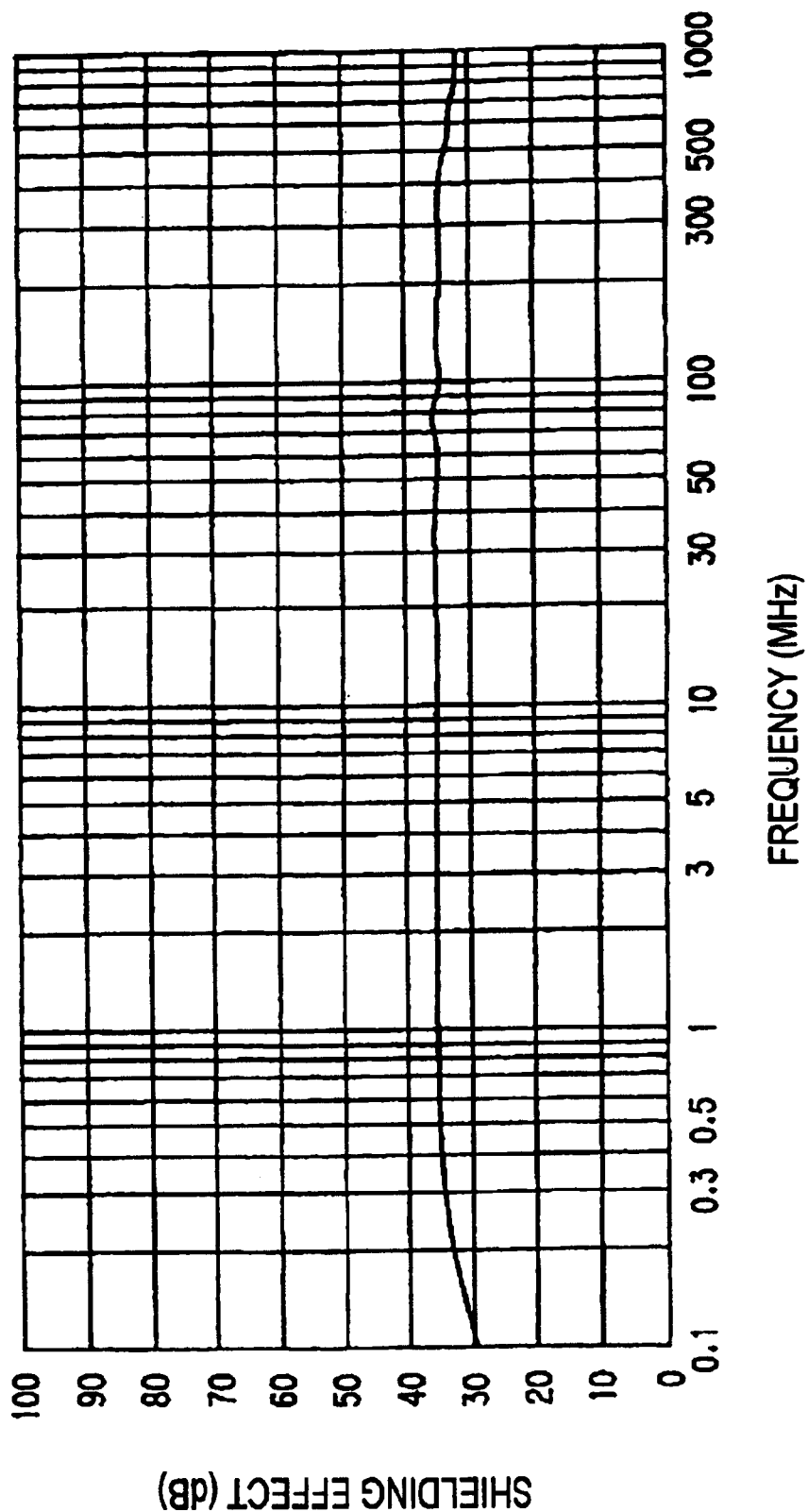
FIG. 2 is a graph showing the shielding characteristic when a mesh member is used as a conductive shielding layer.
Figure 3:
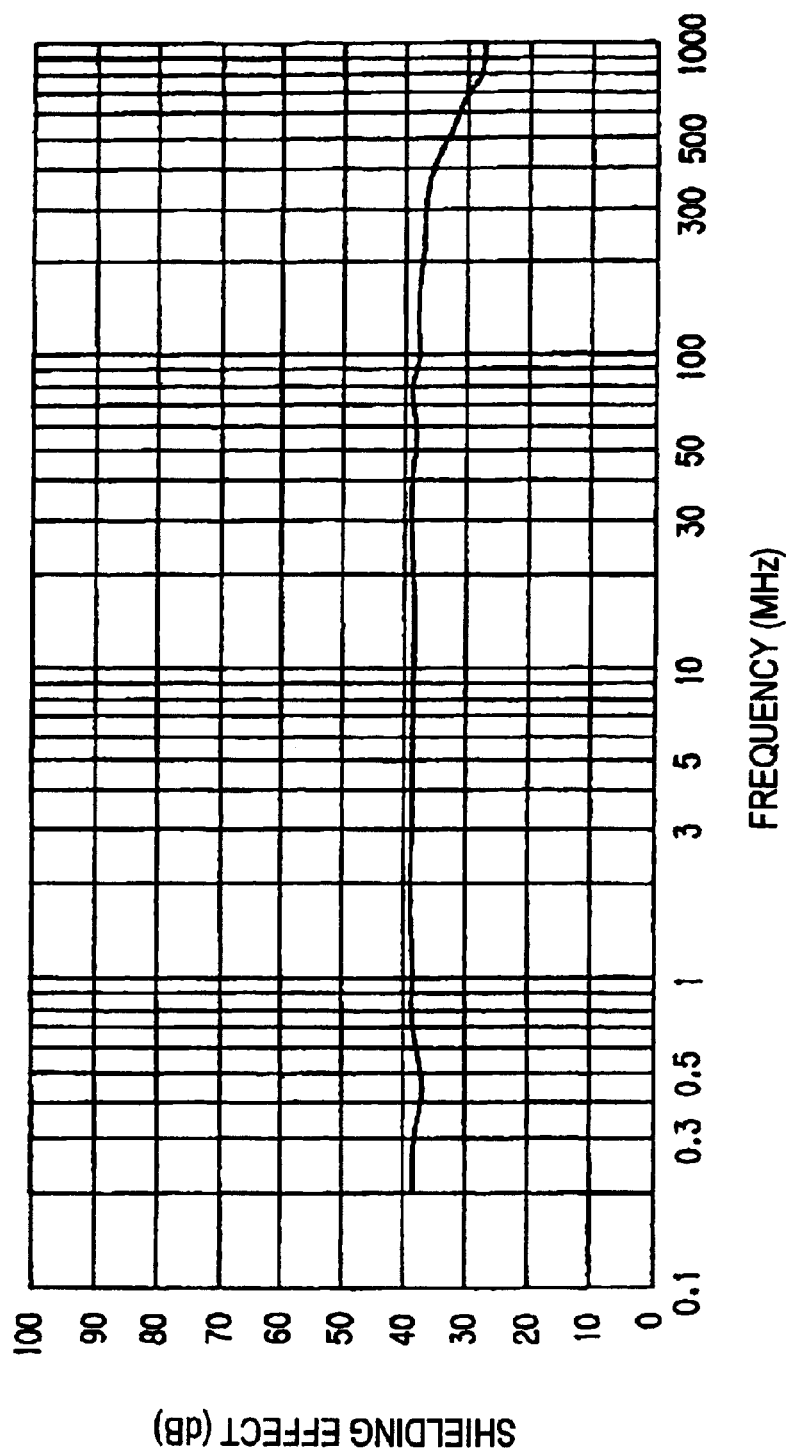
FIG. 3 is a graph showing the shielding characteristic when a film member is used as the conductive shielding layer.

FIG. 1 is an enlarged cross section of a major portion showing a first embodiment of an electromagnetic wave shielding window of the invention. FIG. 2 is a graph showing the shielding characteristic when a mesh member is used as a conductive shielding layer. FIG. 3 is a graph showing the shielding characteristic when a film member is used as the conductive shielding layer.

An electromagnetic wave shielding window 31 of this embodiment is composed of a sheet-like conductive shielding member (conductive shielding layer) 33 having the visible light transmitting property, a pair of window face members 35a and 35b sandwiching the conductive shielding member 33 from the main and back surfaces and having the electrical insulating property and the visible light transmitting property, a conductive adhesive tape 37 laminated to surround the rims of the pair of window face members 35a and 35b entirely with predetermined opposing widths to form a U-shaped cross section, and a conductive window frame member 39 having a squarish U-shaped cross section that closely adheres to the outside of the conductive adhesive tape 37 and thereby holds the rims of the pair of window face members 35a and 35b. The window frame member 39 is a metal frame member connected to an unillustrated earth circuit or the like, and the surface thereof is electrically insulated by an oxide film or a coating film formed thereon. An insulative adhesive agent 36 is applied on the adhesive surface of the conductive adhesive tape 37, and the conductive shielding member 33 and the conductive adhesive tape 37 are brought into a non-conducting state.

With the electromagnetic wave shielding window 31, the conductive adhesive tape 37 is placed in such a manner that predetermined areas thereof oppose each other in parallel with respect to the conductive shielding member 33 through the window face members 35a and 35b, and the conductive shielding member 33 and the conductive adhesion tape 37 are coupled to each other through the insulative adhesive agent 36 serving as an insulation layer. A capacitor having a predetermined electrostatic capacity is then formed between the conductive shielding member 33 and the conductive adhesive tape 37, and electrostatic-capacitance coupling is thereby induced. Hence, the conductive shielding member 33 and the conductive adhesion tape 37 are brought into conduction through the condenser effect for high-frequency components of approximately 1 MHz to 300 MHz, for example, and the conductive shielding member 33 and the conductive adhesive tape 37 are brought into a pseudo electrically connected state. Also, the oxide film or the coating film on the surface of the window frame member 39 is present between the conductive adhesive tape 37 and the window frame member 39, and because these films function as a dielectric, electrostatic-capacitance coupling is induced in the same manner as above.

Consequently, for the high-frequency components, the electromagnetic wave shielding window 31 forms a grounding circuit in which the conductive shielding member 33 is connected to the earth circuit.

A resin material, a glass material, etc. can be used suitably for the window face members 35a and 35b. As the resin material, polyethylene terephthalate, polycarbonate, polymethylmethacrylate, an acrylic board, vinyl chloride, etc. can be used suitably.

A net-like sheet member or a film-like sheet member can be suitably used as the conductive shielding member 33. The net-like sheet member is formed, for example, by coating plastic fibers with metal. The plastic fibers used in this case include polypropylene, polyester, etc. Metals used to coat the plastic fibers include, for example, aluminum, silver, nickel-tin alloy, zinc, and tungsten. Alternatively, metal fibers may be used instead of the plastic fibers.

On the other hand, the film-like sheet member is formed by depositing an ultra-thin film of a conductive material through sputtering or the like. For example, metals, such as aluminum, iron, copper, tungsten, zinc, nickel, tin, iridium, indium, chromium, gold, vanadium, cadmium, silver, platinum, titanium, cobalt, and lead or alloy of the foregoing metals can be used as the conductive material.

The conductive adhesive tape 37 preferably has high adhesion without causing bubbles or the like when adhered, and the one in the fiber-form with a cushioning property can be used suitably. Also, it is preferable to place the conductive adhesive tape 37 to oppose each other in parallel with nearly constant widths of approximately 10 mm to 25 mm respectively from the rims of the window face members 35a and 35b when laminated to the window face members 35a and 35b.

The thickness of the electromagnetic wave shielding window 31 is set as needed depending on the required strength and lightness in weight. For example, given 1.5 mm as the thickness of each of the window face members 35a and 35b and 0.2 mm as the thickness of the conductive shielding member 33 interposed therebetween, then the window face members 35a and 35b having a total thickness of 3.2 mm can be formed.

The electromagnetic wave shielding window 31 arranged as above was manufactured actually to measure the shielding effect thereof, and the results as set forth in FIG. 2 and FIG. 3 were obtained. FIG. 2 shows the measured values of the electromagnetic wave shielding window 31 using a net-like sheet member as the conductive shielding member 33, and FIG. 3 shows the measured values of the electromagnetic wave shielding window 31 using a film-like sheet member as the conductive shielding member 33.

The electromagnetic wave shielding window 31 as an experiment sample was attached to the opening portion provided to a shielding wall in two adjacent experimental spaces in which an electromagnetic wave was shielded by the shielding wall, then an electromagnetic wave transmitter was installed in one experimental space and an electromagnetic wave receiver was installed in the other experimental space, and the shielding effect was measured by reading an electromagnetic wave emitted from the electromagnetic wave transmitter in the electromagnetic wave receiver.

As a result, in the frequency band of 1 MHz to 700 MHz, in particular, in the frequency band of 1 MHz to 300 MHz, it is confirmed that the electromagnetic wave shielding window 31 using the net-like sheet member was able to achieve the shielding effect of 30 dB or above, in particular, in the vicinity of 34 dB, and it is also confirmed that the electromagnetic wave shielding window 31 using the film-like sheet member was able to achieve the shielding effect in the vicinity of 37 dB. In other words, according to the electromagnetic wave shielding window of the invention, it is possible to achieve, in a reliable manner, the shielding effect of 10 to 30 dB or above, which are the values generally admitted as having the shielding effect.

As has been described, according to the electromagnetic wave shielding window 31 of the invention, the shielding effect closed to that achieved through electrical conductive coupling can be achieved through the condenser effect for the high-frequency components while the conductive shielding member (conductive shielding layer) 33 and the window frame member 39 are in a non-conducting state. Also, by laminating the conductive adhesive tape 37 to form a U-shaped cross section, adhesion with respect to the window frame member 39 is improved, which makes it possible to achieve a more stable condenser effect. Further, due to the structure of pinching the conductive shielding member 33 between the window face members 35a and 35b, the condenser effect can be achieved on both the main and back surfaces of the conductive shielding member 33, which makes it possible to obtain electrostatic-capacitance coupling efficiently.

As has been described, deterioration with time will not occur due to the absence of a joint portion used to establish a direct electrical connection, and a stable shielding effect can be thus maintained over a long period. Also, it is possible to obtain the shielding ability so stable that it does not vary from product to product depending on material and workmanship.

Also, the electromagnetic wave shielding window 31 is arranged in such a manner that the conductive shielding member 33 and the conductive adhesive tape 37 are assembled in a non-conducting structure. Hence, it is possible to omit an elaborate electrical conductive coupling work for bringing the conductive shielding member 33 and the conductive adhesive tape 37 into conduction by applying a conductive adhesive agent or the like as with the conventional structure.

The electromagnetic wave shielding window 31 can be assembled with a work such that the window frame member 39 is merely attached to the assembly, in which the conductive adhesive tape is laminated to the rims of the window face members 35a and 35b sandwiching the conductive shielding member 33, and an elaborate electrical conductive coupling work for enabling conduction, such as tap processing, can be therefore eliminated. As a result, the manufacturing process can be simplified markedly.

Also, according to the electromagnetic wave shielding window 31 using the net-like sheet member made of conductive fibers as the conductive shielding member 33, because every single fiber forming the net-like sheet member has conductivity, it is possible to obtain conductivity almost as good as that of metal while possessing the visible light transmitting property.

On the other hand, according to the electromagnetic wave shielding window 31 using the film-like sheet member as the conductive shielding member 33, because the conductive shielding member 33 is a film, it can be formed in a single plane, which can reduce leaking of an electromagnetic wave in comparison with the net structure having openings.

An insulative adhesive tape may be used instead of the conductive adhesive tape 37. In this case, the conductive shielding member 33 and the window frame member 39 are also brought into an electrostatic-capacitance coupled state, and the grounding circuit, in which the conductive shielding member 33 is connected to the earth circuit through the condenser effect, is also formed for the high-frequency components. The electromagnetic wave shielding effect can be thus achieved. This arrangement is applicable even when the window face members 35a and 35b are as thin as approximately 0.3 mm provided that the arrangement can ensure the strength.

Figure 4:
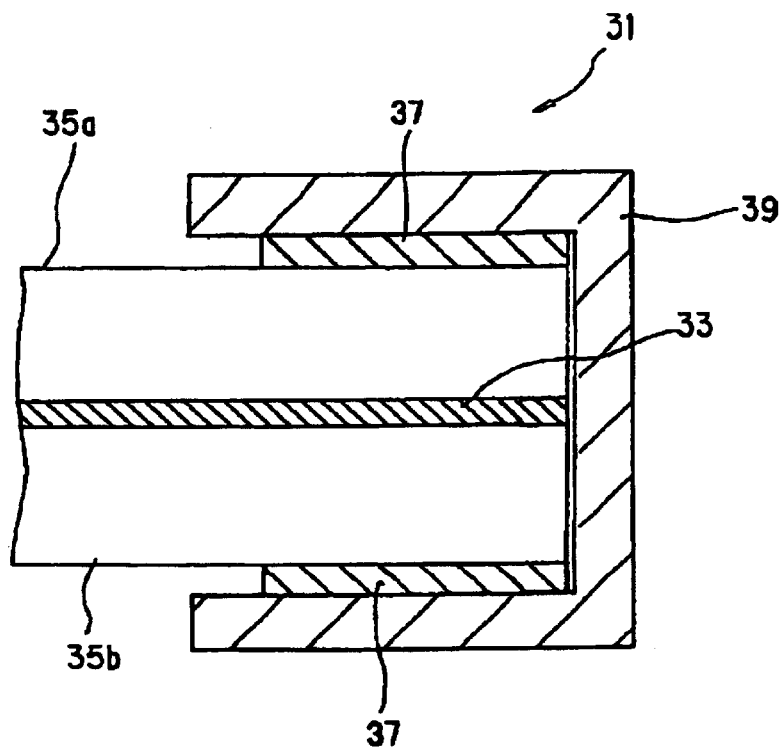
FIG. 4 is a view showing one example of an arrangement of an electromagnetic wave shielding window in which a conductive adhesive tape is laminated to window face members on both surfaces so as to oppose each other.
Figure 5:
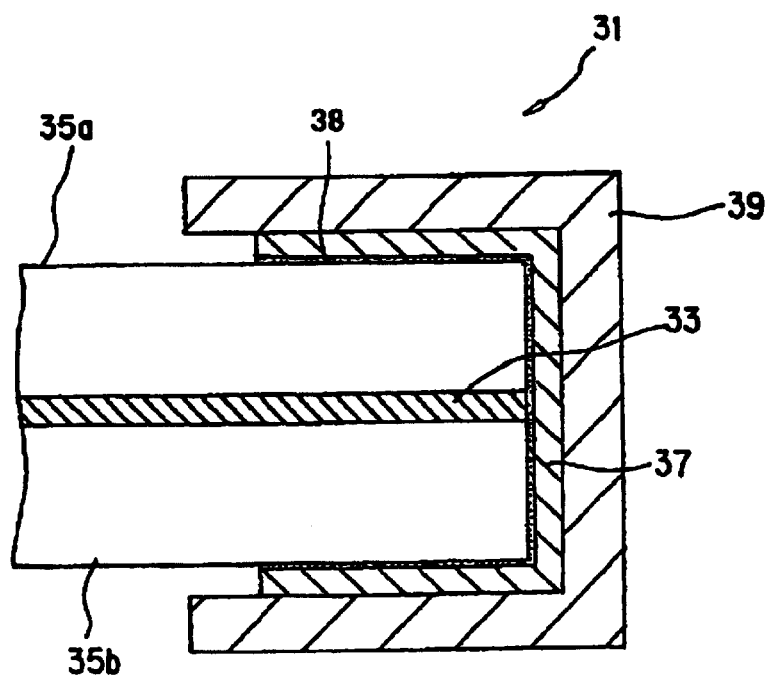
FIG. 5 is a view showing one example of an arrangement of an electromagnetic wave shielding window in which a conductive adhesive agent is used as an adhesive agent for the conductive adhesive tape.

Besides being laminated to the edge portions of the window face members to form a U-shaped cross section, the conductive adhesive tape 37 may be provided separately to the respective opposing surfaces as shown in FIG. 4. Further, as shown in FIG. 5, it may be arranged in such a manner that the conductive shielding member 33 and the conductive adhesive tape 37 come in contact with each other by using a conductive adhesive agent 38 as an adhesive agent for the conductive adhesive tape 37 and bringing the conductive adhesive tape 37 in close adhesion to the end portion of the conductive shielding member 33. In this case, not only the conductive shielding member 33 and the earth circuit are brought into conduction, but also conduction for the high-frequency components is enabled due to the condenser effect, which makes it possible to achieve the shielding effect in a more reliable manner.

A second embodiment of the electromagnetic wave shielding window of the invention will now be explained.

Figure 6:
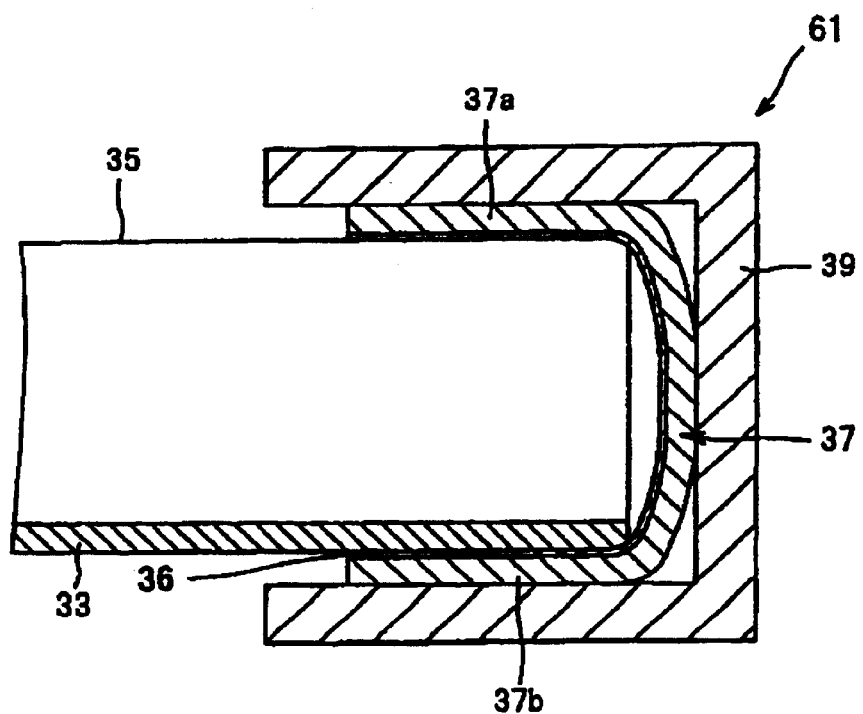
FIG. 6 is an enlarged cross section of a major portion showing a second embodiment of the electromagnetic wave shielding window of the invention.

FIG. 6 is an enlarged cross section of a major portion showing the second embodiment of the electromagnetic wave shielding window of the invention. In the respective embodiments described below, the same members as the members shown in FIG. 1 are labeled with the same reference numerals, and the duplicate explanation will be omitted.

An electromagnetic wave shielding window 61 of this embodiment is composed of a single window face member 35 having the electrical insulating property and the visible light transmitting property, a sheet-like conductive shielding member 33 laminated to one surface of the window face member 35 and having the visible light transmitting property, a conductive adhesive tape 37 laminated to surround the rim of the window face member 35, to which the conductive shielding member 33 is laminated, entirely with a predetermined width to form a U-shaped cross section, an insulative adhesive agent 36 to be used as an insulation layer interposed at least between the conductive adhesive tape 37 and the conductive shielding member 33, and a window frame member 39 having a squarish U-shaped cross section that adheres to the outside of the conductive adhesive tape 37 and thereby holds the rim of the window face member 35.

With the electromagnetic wave shielding window 61, the conductive shielding member 33 laminated, through the insulation layer (insulative adhesive agent 36), to the rim of the window face member 35 to which is laminated the conductive shielding member 33 is placed to oppose a conductive adhesive tape 37a facing the conductive shielding member 33 through the window face member 35, without bringing the conductive shielding member 33 and the conductive adhesive tape 37 into conduction. This gives rise to the condenser effect between the conductive shielding member 33 and the conductive adhesive tape 37a, and the electromagnetic wave shielding effect can be thereby achieved. Because the conductive shielding member 33 is also placed to oppose a conductive adhesive tape 37b facing the conductive shielding member 33 through the insulation layer, the condenser effect also takes place between the conductive shielding member 33 and the conductive adhesive tape 37b.

Hence, according to the electromagnetic wave shielding window 61, the electromagnetic wave shielding window 61 can be formed in a simple structure using a single window face member 35 alone without the need to pinch the conductive shielding member 33 between a pair of the window face members 35.

A third embodiment of the electromagnetic wave shielding window of the invention will now be explained.

Figure 7:
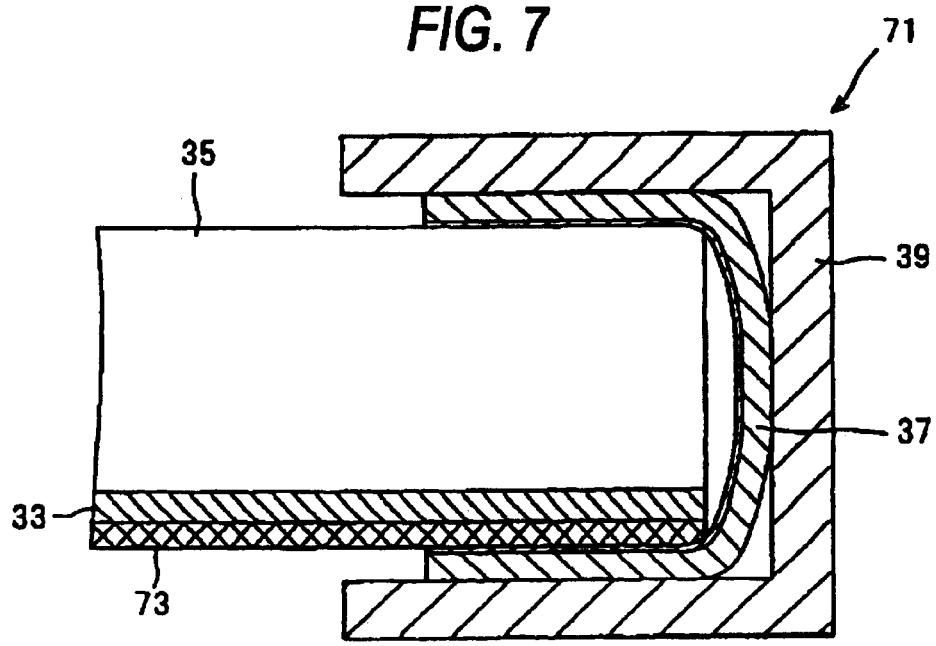
FIG. 7 is an enlarged cross section of a major portion showing a third embodiment of the electromagnetic wave shielding window of the invention.

FIG. 7 is an enlarged cross section of a major portion showing the third embodiment of the electromagnetic wave shielding window of the invention.

An electromagnetic wave shielding window 71 of this embodiment is arranged in such a manner that a protection sheet 73 having the electrical insulating property and deposited on the entire surface of the conductive shielding member 33 is used as the insulation layer 62 in the second embodiment. The other arrangements are the same as those of the aforementioned electromagnetic wave shielding window 61.

With the electromagnetic wave shielding window 71, the protection sheet 73 having the electrical insulating property is further deposited across the front surface of the conductive shielding member 33 laminated to one surface of the window face member 35, and the conductive shielding member 33 and the conductive adhesive tape 37 are placed to oppose each other through the protection sheet 73. It is thus possible to protect the conductive shielding member 33 while at the same time placing the conductive shielding member 33 and the conductive adhesive tape 37 to oppose each other in an insulating structure.

A fourth embodiment of the electromagnetic wave shielding window of the invention will now be explained.

Figure 8:
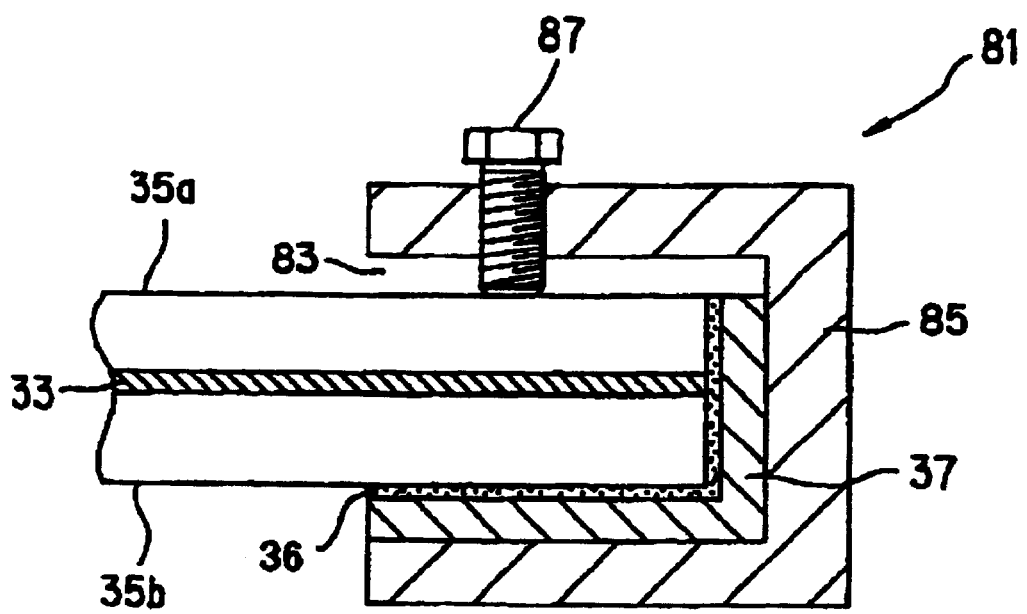
FIG. 8 is an enlarged cross section of a major portion showing a fourth embodiment of the electromagnetic wave shielding window of the invention.

FIG. 8 is an enlarged cross section of a major portion showing the fourth embodiment of the electromagnetic wave shielding window of the invention.

An electromagnetic wave shielding window 81 of this embodiment is composed of a sheet-like conductive shielding member 33 having the visible light transmitting property, a pair of window face members 35a and 35b sandwiching the conductive shielding member 33 from the main and back surfaces and having the electrical insulating property and the visible light transmitting property, a conductive adhesive tape 37 laminated to surround the end faces and at least one of the rims of the pair of window face members 35a and 35b entirely with a predetermined width to form an L-shaped cross section, a window frame member 85 having a squarish U-shaped cross section that closely adheres to the outside of the conductive adhesive tape 37 and thereby holds the rims of the pair of window face members 35a and 35b in the thickness direction with a predetermined gap 83, and an adjustment screw 87 threaded into the window frame member 85 with the tip end thereof abutting against the rim of the window face member 35a to which the conductive adhesive tape 37 is not laminated. An insulative adhesive agent 36 is applied to the adhesive surface of the conductive adhesive tape 37.

With the electromagnetic wave shielding window 81, an assembly composed of the pair of window face members 35a and 35b pinching the conductive shielding member 33 in between and the conductive adhesive tape 37 laminated to one surface of the window face members 35a and 35b is accommodated in the inner side of the window frame member 85 having the squarish U-shaped cross section. By tightening the adjustment screw 87 threaded into the window frame member 85, the rim of the window face member 35a, to which the conductive adhesive tape 37 is not laminated, is pressed against by the tip end of the adjustment screw 87.

Hence, the pair of window face members 35a and 35b pinching the conductive shielding member 33 and the conductive adhesive tape 37 are pressurized by the adjustment screw 87 and the window frame member 85, and adhesion is thereby increased. Also, by loosening the adjustment screw 87, the holding of the window frame member 85 with respect to the assembly can be released, and the assembly can be readily removed from the window frame member 85.

In the respective embodiments of the electromagnetic wave shielding window described above, explanations were given to a case where the conductive shielding member 33 is laminated to the window face member 35. However, the invention is not limited to this arrangement, and it may be arranged in such a manner that the conductive shielding layer is formed by spray coating the shielding layer or printing the shielding layer onto the surface of the window face member 35, or alternatively, the window face member and the conductive shielding layer may be merely combined instead of being laminated. Further, the conductive shielding layer itself may be formed as the window face member. Also, the shielding effect of a certain degree can be achieved by an arrangement such that the conductive shielding member 33 is provided to the rim of the window face member 35 at least partially instead of being providing to the rim entirely.

An electronic parts mounting apparatus will now be explained as one example of a manufacturing apparatus in which the electromagnetic wave shielding window of the invention is used.

Figure 9:
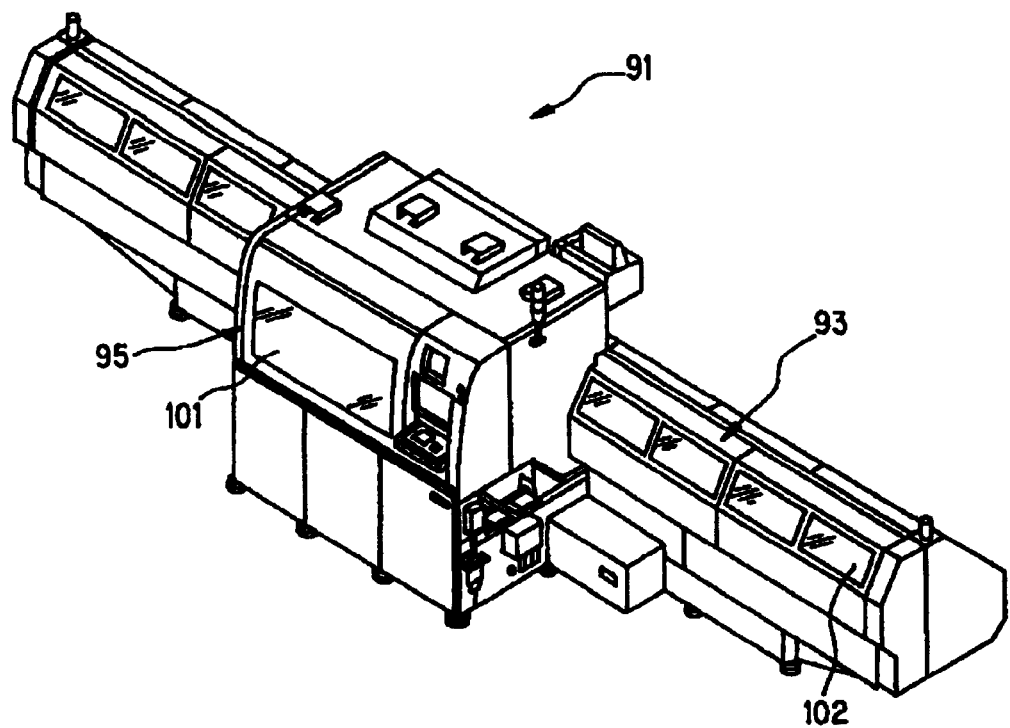
FIG. 9 is a perspective view showing an outward appearance of an electronic parts mounting apparatus in which the electromagnetic wave shielding window of the invention is used.
Figure 10:
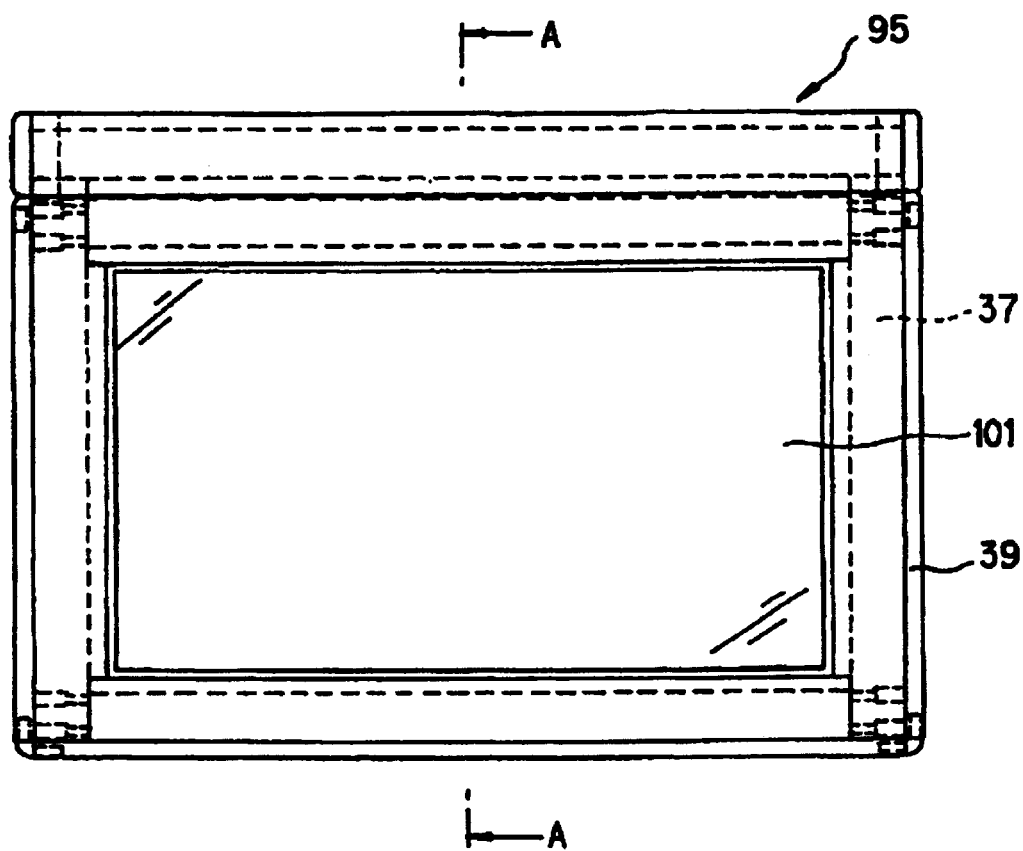
FIG. 10 is a plan view of a front cover panel shown in FIG. 9.
Figure 11:
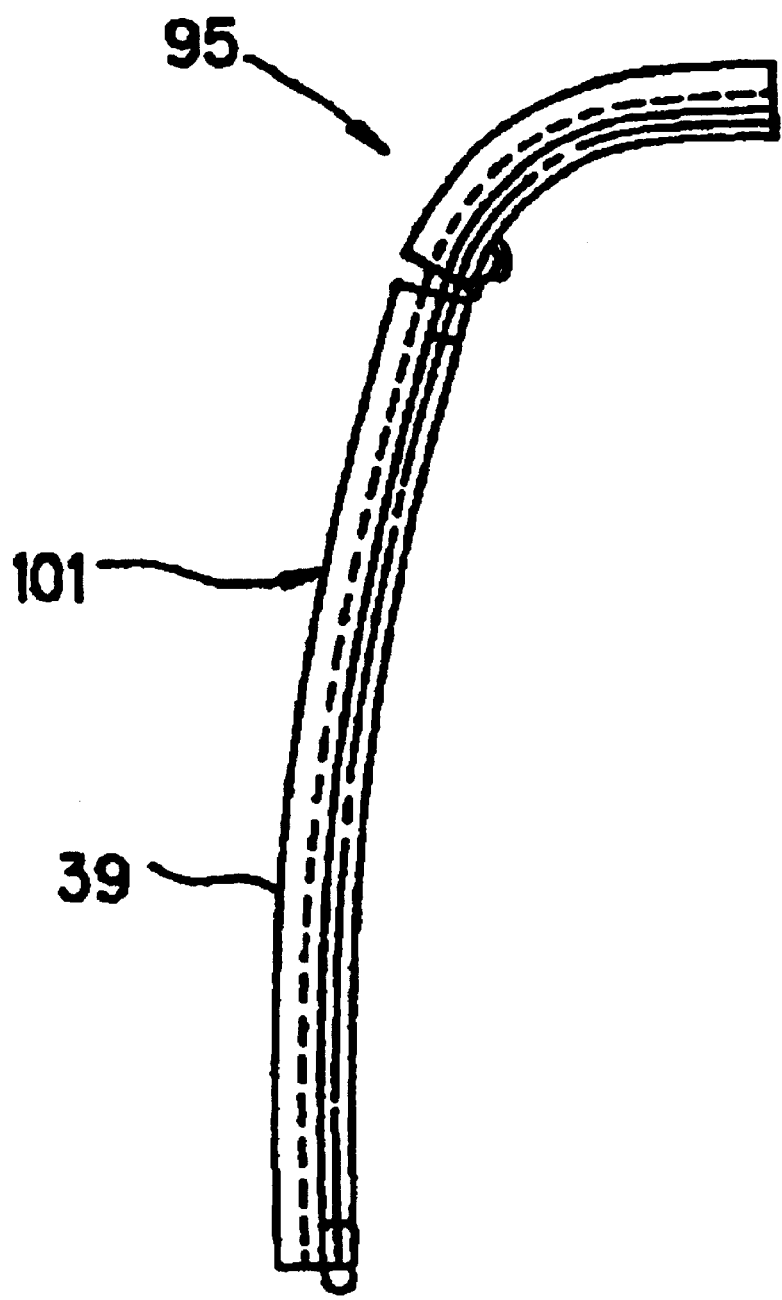
FIG. 11 is a side view of FIG. 10.
Figure 12:
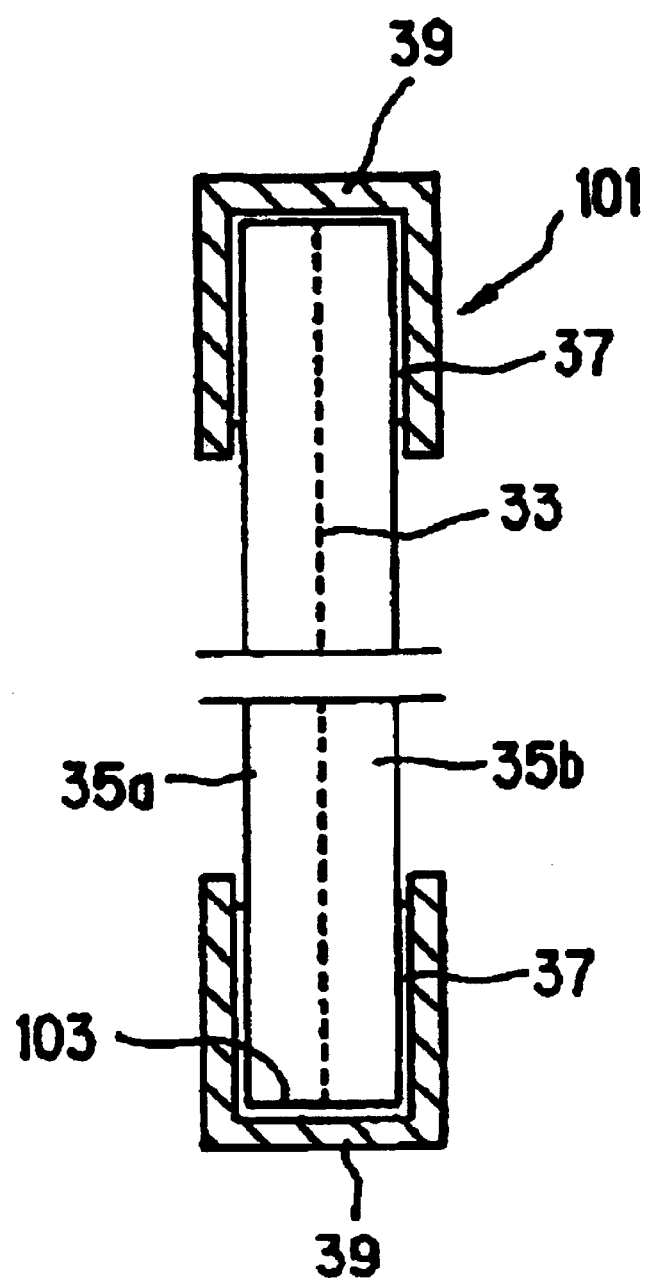
FIG. 12 is a cross section taken along the line A—A of FIG. 10.

FIG. 9 is a perspective view showing an outward appearance of an electronic parts mounting apparatus in which the electromagnetic wave shielding window of the invention is used. FIG. 10 is a plan view of a front cover panel shown in FIG. 9. FIG. 11 is a side view of FIG. 10. FIG. 12 is a cross section taken along the line A—A of FIG. 10.

A parts mounting apparatus equipped with a rotary head has been in widespread use as an electronic parts mounting apparatus 91 that mounts electronic parts, including package parts, such as an LSI and an IC, chip parts, such as a condenser chip and a resistance chip, etc. onto a circuit board at a high speed. The electronic parts mounting apparatus 91 equipped with a rotary head takes out electronic parts from a parts supply unit 93 holding electronic parts through the use of a plurality of mounting heads provided on the periphery of the rotary head by index rotating the rotary head, and successively mounts the electronic parts on a circuit board positioned by an XY table.

A plurality of mounting heads are provided on the periphery of the rotary head in the circumferential direction at regular intervals, and each mounting head performs a cycle starting with attraction of an electronic part from the parts supply unit followed by mounting of the electronic part being attracted onto the circuit board on the XY table and ending with attraction of an electronic part again from the parts supply unit while the rotary head rotates once.

An electronic parts mounting working space, in which the rotary head is provided, is covered with a front cover panel 95. The front cover panel 95 is provided with a view port through which is confirmed an operation, such as the parts mounting operation by the rotary head, and the electromagnetic wave shielding window of any of the embodiments above is attached to the view port. Herein, an electromagnetic wave shielding window 101 of the arrangement same as the arrangement described in the first embodiment is used as one example.

To be more specific, the electromagnetic wave shielding window 101 is composed of a sheet-like conductive shielding layer 33 having the visible light transmitting property, a pair of window face members 35a and 35b sandwiching the conductive shielding layer 33 from the main and back surfaces and having the electrical insulating property and the visible light transmitting property, a conductive adhesive tape 37 laminated to surround the rims of the pair of window face members 35a and 35b with a predetermined width to form a U-shaped cross section, and a window frame member 39 having a squarish U-shaped cross section that closely adheres to the outside of the conductive adhesion tape 37 and thereby holds the rims of the pair of window face members 35a and 35b. The window frame member 39 is connected to an earth circuit through an unillustrated apparatus frame or the like.

With the electronic parts mounting apparatus 91, the aforementioned electromagnetic wave shielding window 101 is provided to the front cover panel 95. Hence, in contrast to the case of using the conventional electromagnetic wave shielding window that needs a direct electrical connection, the conductive shielding layer 33 and the conductive adhesive tape 37 can remain in a non-conducting structure. This eliminates the need to provide conducting means to the end portions of the window face members 35a and 35b, and the assembly work can be therefore simplified markedly. Hence, not only can the costs of the overall mounting apparatus be saved, but also the beauty of appearance can be increased because the outward appearance of the electromagnetic wave shielding window can be simpler.

Also, besides the aforementioned view port used in confirming the operation of the rotary head, the electromagnetic wave shielding window of the invention can be suitably applied to a view port 102 provided to the parts supply unit 93, for example. The electronic parts mounting apparatus 91 is not limited to the rotary head type, either, and it may adopt an arrangement of any other type. As well, the electromagnetic wave shielding window of the invention can be suitably applied to a view port in any other apparatus, including other electronic circuit board processing machines that need electromagnetic wave shielding, for example, a cream solder printing machine that prints cream solder on a circuit board, an adhesive agent applying machine that applies an adhesive agent used to fix an electronic part, a board inspecting machine that inspects a printing state of cream solder and a mounting state of an electronic part, etc.

The effect of the electromagnetic wave shielding described in association with the manufacturing apparatus is also effective for any of those having a window portion for visual confirmation, and the effect is exerted in the same manner even with a transport system and a building construction. An explanation of the arrangement of major portions of the transport system and the building construction is omitted to avoid duplication, and explanations will be given only with reference to the drawings showing application examples.

Figure 13:
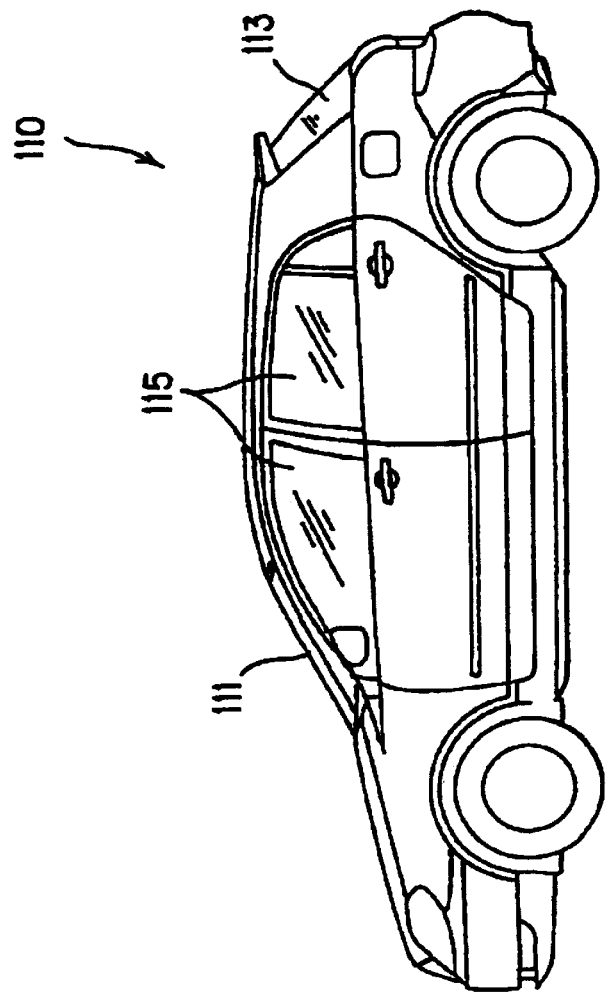
FIG. 13 is a view showing an outward appearance of one example of a vehicle to which the electromagnetic wave shielding window of the invention is applied.
Figure 13:
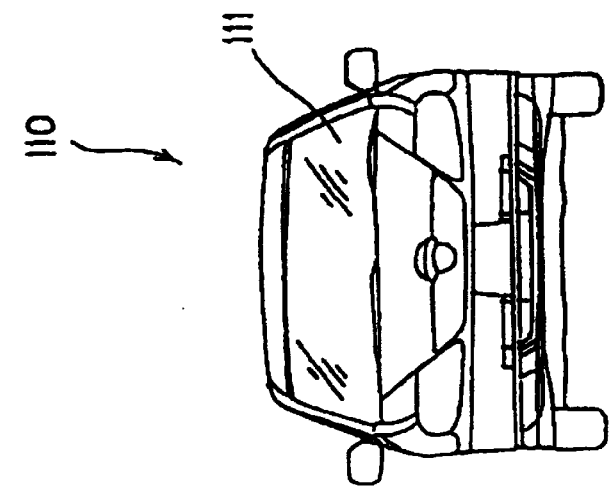

Firstly, a vehicle will be named as a transport system in which the electromagnetic wave shielding window of the invention is used. FIG. 13 shows one example of a vehicle to which the electromagnetic wave shielding window of the invention is applied. FIG. 13(a) is a front view and FIG. 13(b) is a side view of a vehicle 110.

By applying the electromagnetic wave shielding window of the invention to each of a front window 111, a rear window 113, and side windows 115 attached to the respective doors of the vehicle 110, not only can the beauty of appearance be increased by making the window frame structure of the vehicle simpler, but also the weight and the costs can be reduced by simplifying the process of production. It should be noted that the application is not limited to a typical private vehicle shown in the drawing, and the same effect can be achieved, for example, with a vehicle for a specific purpose.

Figure 14:
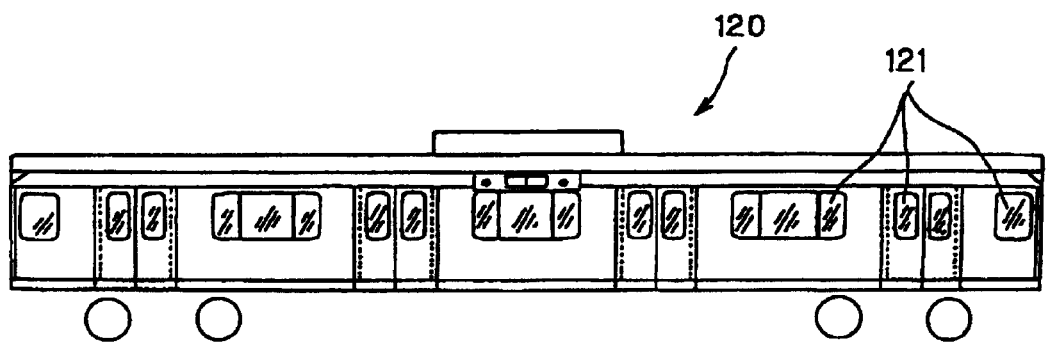
FIG. 14 is a view showing an outward appearance of one example of a train to which the electromagnetic wave shielding window of the invention is applied.

Also, a train is named as another example of the transport system. FIG. 14 shows one example of a train to which the electromagnetic wave shielding window of the invention is applied. By applying the electromagnetic wave shielding window of the invention to respective windows 121 provided to a train 120, the effect same as above can be achieved.

Figure 15:
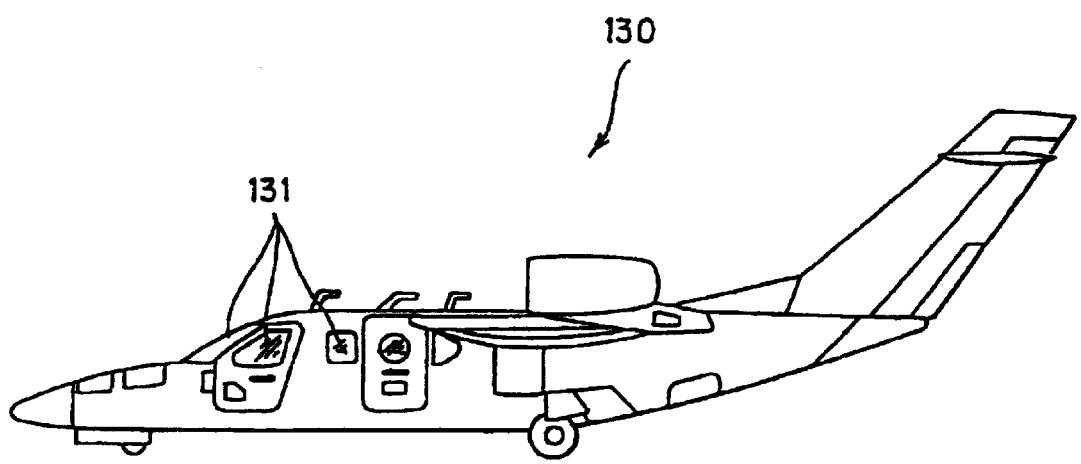
FIG. 15 s a view showing an outward appearance of one example of an airplane to which the electromagnetic wave shielding window of the invention is applied.

Further, an airplane is named as still another example of the transport system. FIG. 15 shows one example of an airplane to which the electromagnetic wave shielding window of the invention is applied. By applying the electromagnetic wave shielding window of the invention to respective exterior and interior windows 131 of an airplane 130, it is possible to forestall a malfunction of equipment induced by an electromagnetic wave from inside and outside of the airplane. Although it is not illustrated, when applied as windows of a vessel or transport means to an outer space, the effect same as above can be achieved as well.

Figure 16:
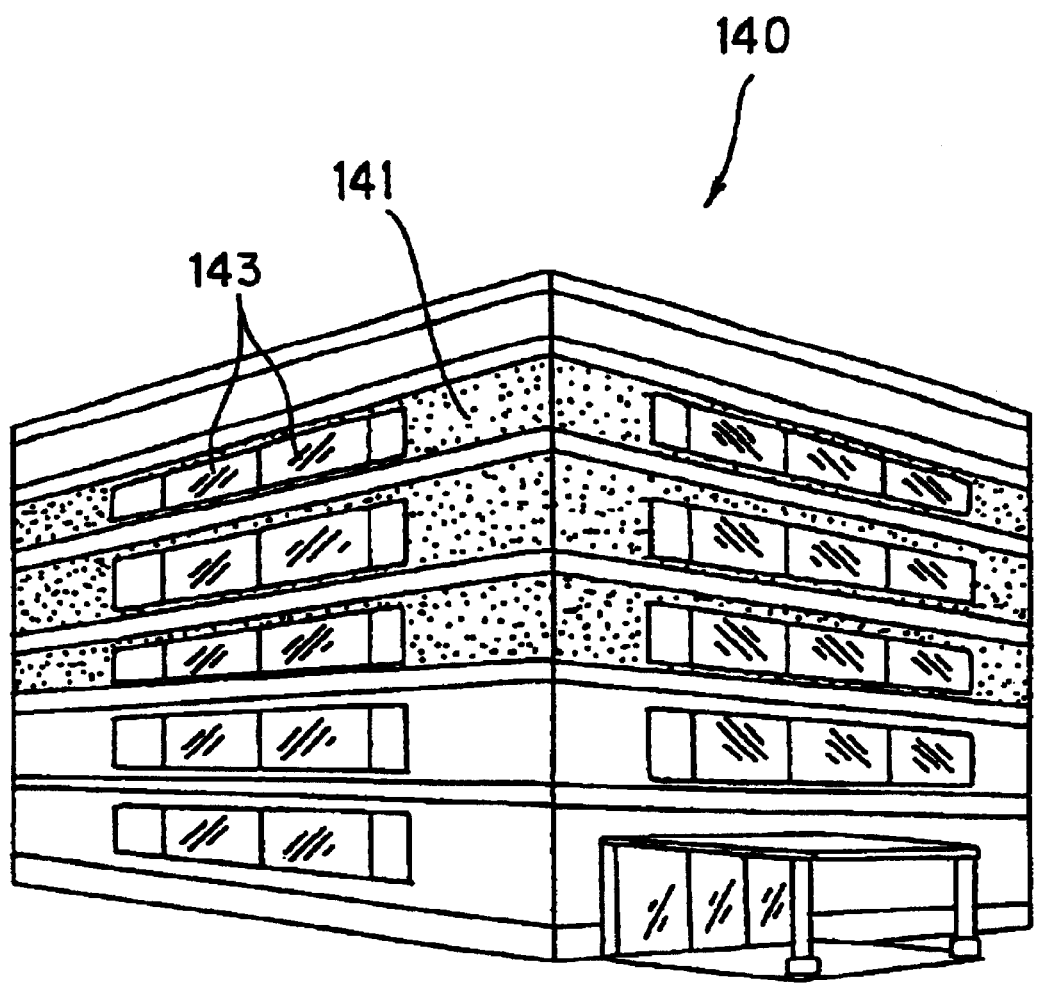
FIG. 16 is a view showing an outward appearance of one example of a building to which the electromagnetic wave shielding window of the invention is applied.
Figure 17:
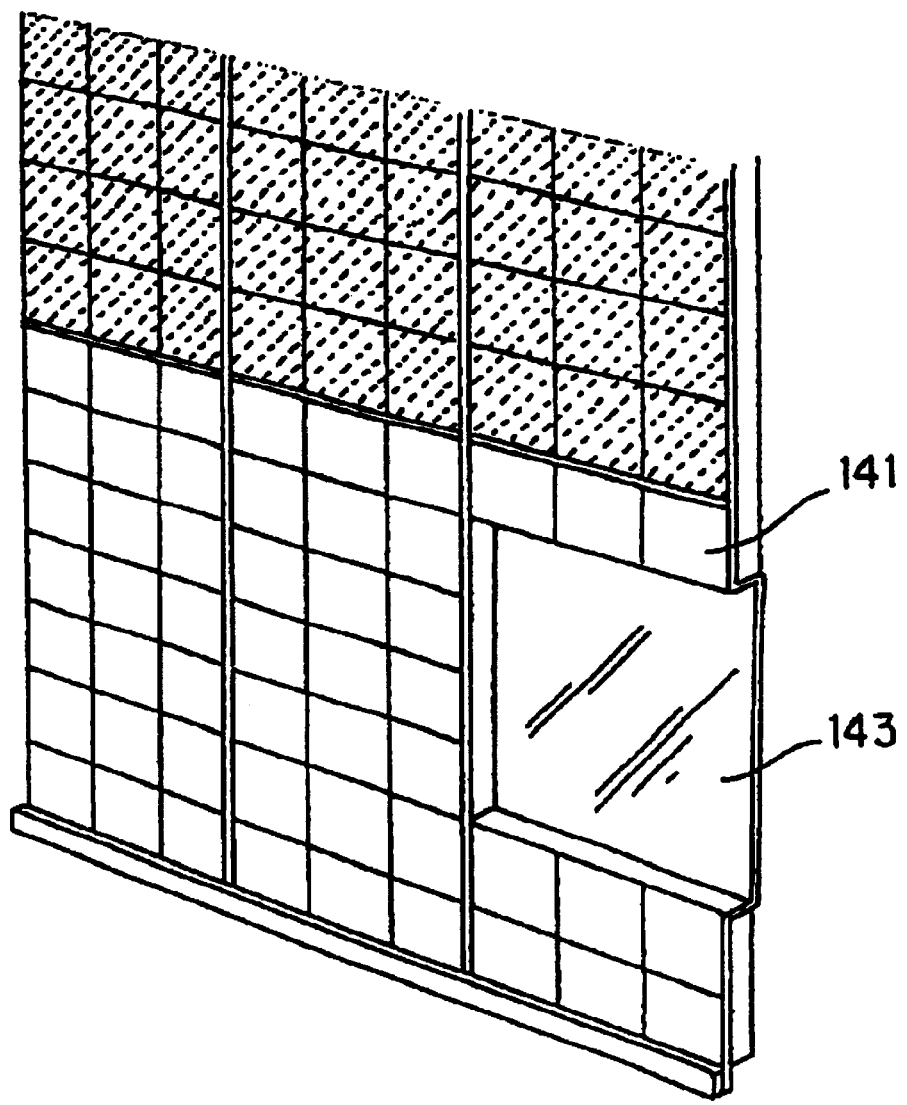
FIG. 17 is a partial enlarged cross section showing an enlarged wall surface of the building shown in FIG. 16.
Figure 18:
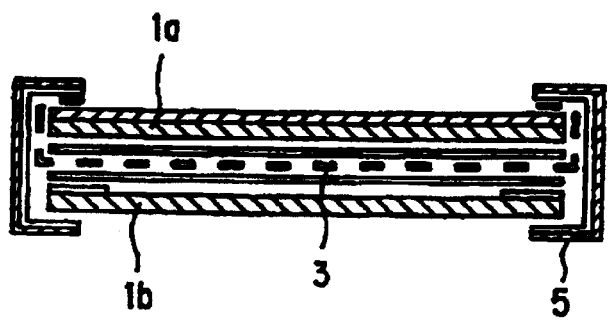
FIG. 18 is a cross section of a conventional light-transmitting window member having an electromagnetic wave shielding ability.
Figure 19:
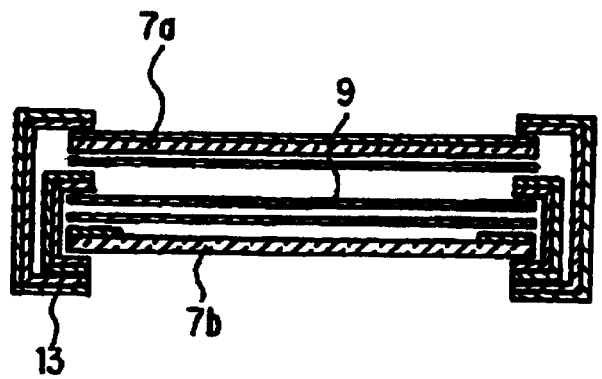
FIG. 19 is a cross section of another conventional light-transmitting window member having an electromagnetic wave shielding ability.
Figure 20:
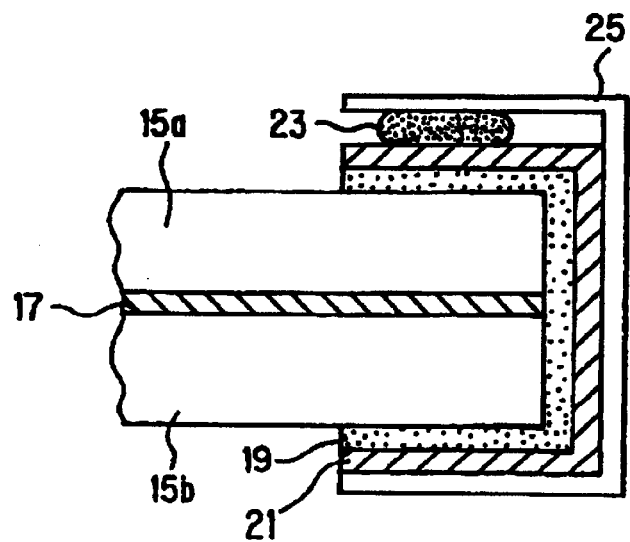
FIG. 20 is an enlarged cross section of a major portion of a conventional electromagnetic wave shielding window.

Then, a structure, such as a building, is named as a building construction in which the electromagnetic wave shielding window of the invention is used. FIG. 16 is a view showing one example of a building to which the electromagnetic wave shielding window of the invention is applied. FIG. 17 is a partial enlarged cross section showing an enlarged wall surface of the building. By applying the electromagnetic wave shielding window of the invention to respective windows 143 provided to a wall surface 141 of a building 140, windows of a simple arrangement that excel in beauty can be obtained. Also, it is possible to prevent unwanted emission of an electromagnetic wave generated inside the building to the neighborhood of the building, and a structure benign to electromagnetic wave environments can be thus obtained.

As has been described in detail, according to the electromagnetic wave shielding method of the invention, a conductive shielding layer having the visible light transmitting property is provided on the surface of a window face member having the electrical insulating property and the visible light transmitting property, and the window face member provided with the conductive shielding layer is brought into close adhesion and thereby fixed to an inside of a conductive window frame through an insulation layer provided to a rim portion, whereby electrostatic-capacitance coupling is induced between the conductive shielding layer and the window frame. Due to the resulting condenser effect, it is possible to achieve the shielding effect close to that achieved in a directly, electrically connected state for high-frequency components even in a non-conducting state. As a consequence, deterioration with time will not occur due to the absence of a joint portion, and a stable shielding effect can be thus maintained over a long period.

According to the electromagnetic wave shielding window of the invention, a conductive shielding layer is provided on the surface of a window face member having the electrical insulating property, and a conductive adhesive tape is placed in such a manner that predetermined areas thereof oppose each other with respect to the conductive shielding layer, whereby the condenser effect takes place, which brings the conductive shielding layer and the conductive adhesion tape into a pseudo connected state in a non-conducting structure. It is thus possible to omit an elaborate electrical conductive coupling work such that brings the conductive shielding layer and the conductive adhesion tape into conduction by applying a conductive adhesive agent or the like as in the conventional structure, and man-hours needed for assembly and the manufacturing costs can be reduced.

The manufacturing apparatus, the transport system, and the building construction of the invention have the electromagnetic wave shielding window of the invention in at least part of a view port. Hence, the manufacturing costs can be saved and the outward appearance of the electromagnetic wave shielding window can be simpler because the conductive shielding layer and the conductive adhesive tape can remain in a non-conducting structure, thereby making it possible to increase the beauty of appearance.

What is claimed is:

1. An electromagnetic wave shielding method, comprising the steps of:
   a first step of providing a conductive shielding layer having a visible light transmitting property on a surface of a window face member having an electrical insulating property and a visible light transmitting property;

a second step of:
laminating a cushioned conductive adhesive tape by using an insulation adhesive layer to a rim portion of said window face member provided with said conductive shielding layer in such a manner that predetermined areas thereof oppose each other, and at the same time, fixing said window face member provided with said conductive shielding layer and laminated with said conductive tape by bringing into close adhesion to a conductive window frame member through an insulation layer, wherein a sectional plan of said window frame member shapes approximate horseshoe having integral and almost similarly cross section; and a third step of inducing electrostatic-capacitance couplings between said conductive shielding layer and said conductive tape and between said conductive shielding layer and said window frame member.

2. An electromagnetic wave shielding window comprising:

a window face member having an electrical insulating property and a visible light transmitting property;

a conductive shielding layer laminated to a surface of said window face member and having a visible light transmitting property; and a conductive window frame member to which said window face member provided with said conductive shielding layer is brought into close adhesion and thereby fixed through an insulation layer provided to a rim portion of said window face member, wherein a sectional plan of said window frame member shapes approximate horseshoe having integrally and almost similarly cross section, wherein, by using an insulation adhesive, a cushioned conductive tape is placed next to said insulation layer at said rim portion of said window face member provided with said conductive shielding layer in such a manner that predetermined areas thereof on said rim portion oppose each other.

3. The electromagnetic wave shielding window according to claim 2,
wherein said insulation layer includes at least one of said window face member and an insulative surface layer formed on a surface of said window frame member.

4. The electromagnetic wave shielding window according to claim 2,
wherein said conductive tape is laminated to form a U-shaped cross section.

5. The electromagnetic wave shielding window according to claim 2,
wherein said conductive shielding layer is pinched between a pair of said window face members.

6. The electromagnetic wave shielding window according to claim 2,
wherein said conductive shielding layer is provided on only one surface of said window face member.

7. The electromagnetic wave shielding window according to claim 6,
wherein a protection sheet for said conductive shielding layer is laminated to an outside surface of said window face member on a side where said conductive shielding layer is provided.

8. The electromagnetic wave shielding window according to claim 2,
wherein said conductive shielding layer is a net-like sheet member made of conductive fibers or fibers whose surfaces are coated with a conductive material.

9. The electromagnetic wave shielding window according to claim 2,
wherein said conductive shielding layer is a film-like sheet member having a conductive thin-film layer.

10. A manufacturing apparatus having an electromagnetic wave shielding window, said manufacturing apparatus being characterized in that said manufacturing apparatus is provided with a view port shielded from an electromagnetic wave, through which visual confirmation of an interior of said manufacturing apparatus is allowed, and at least part of said view port is the electromagnetic wave shielding window according to any of claims 2 to 9.

11. A transport system having an electromagnetic wave shielding window, said transport system being characterized in that said transport system is provided with a view port shielded from an electromagnetic wave, through which visual confirmation of an outside of said transport system is allowed, and at least part of said view port is the electromagnetic wave shielding window according to any of claims 2 to 9.

12. A building construction having an electromagnetic wave shielding window, said building construction being characterized in that said building construction is provided with a view port shielded from an electromagnetic wave, through which visual confirmation of an outside of said building construction is allowed, and at least part of said view port is the electromagnetic wave shielding window according to any of claims 2 to 9.

* * * * *

UNITED STATES PATENT AND TRADEMARK OFFICE
CERTIFICATE OF CORRECTION

PATENT NO. : 6,921,859 B2  Page 1 of 1
APPLICATION NO. : 10/809086
DATED : July 26, 2005
INVENTOR(S) : Osamu Hikita and Takashi Kakimoto It is certified that error appears in the above-identified patent and that said Letters Patent is hereby corrected as shown below:

On Cover Page, Please delete "Item (30), Foreign Application Priorty Data, Mar. 31, 2000 (JP) 2000-098242"

Signed and Sealed this

Fifth Day of May, 2009

JOHN DOLL
*Acting Director of the United States Patent and Trademark Office*